(12) United States Patent
Menezo

(10) Patent No.: US 12,374,858 B2
(45) Date of Patent: Jul. 29, 2025

(54) PHOTONIC DEVICE WITH IMPROVED HEAT DISSIPATION FOR III-V/SI HETEROGENEOUS LASER AND ASSOCIATED MANUFACTURING METHOD

(71) Applicant: Scintil Photonics, Grenoble (FR)

(72) Inventor: Sylvie Menezo, Grenoble (FR)

(73) Assignee: Scintil Photonics, Grenoble (FR)

( * ) Notice: Subject to any disclaimer, the term of this patent is extended or adjusted under 35 U.S.C. 154(b) by 297 days.

(21) Appl. No.: 18/249,324

(22) PCT Filed: Aug. 27, 2021

(86) PCT No.: PCT/FR2021/051494
§ 371 (c)(1),
(2) Date: Apr. 17, 2023

(87) PCT Pub. No.: WO2022/079363
PCT Pub. Date: Apr. 21, 2022

(65) Prior Publication Data
US 2023/0420911 A1    Dec. 28, 2023

(30) Foreign Application Priority Data

Oct. 16, 2020    (FR) ...................................... 2010606

(51) Int. Cl.
*H01S 5/024*    (2006.01)
*G02B 6/132*    (2006.01)
(Continued)

(52) U.S. Cl.
CPC .......... *H01S 5/02461* (2013.01); *G02B 6/132* (2013.01); *G02B 6/136* (2013.01);
(Continued)

(58) Field of Classification Search
CPC .... H01S 5/02461; H01S 5/021; H01S 5/0216; H01S 5/0217; H01S 5/02492;
(Continued)

(56) References Cited

U.S. PATENT DOCUMENTS 9,360,620 B2*   6/2016  Ramaswamy ....... G02B 6/4269
9,461,441 B2*  10/2016  Chantre ................ H01S 5/0268
(Continued)

FOREIGN PATENT DOCUMENTS

EP    2685297 B1   1/2014
EP    3015888 B1   5/2016

OTHER PUBLICATIONS

International Search Report for International Application No. PCT/FR2021/051494 dated Dec. 22, 2021, 3 pages.
(Continued)

*Primary Examiner* — John Bedtelyon
(74) *Attorney, Agent, or Firm* — TraskBritt

(57) ABSTRACT

A photonic device comprises: —a support layer, —an optical layer extending in a main plane (x, y), subdivided into at least a first region and a second region adjacent in the main plane (x, y), and comprising a first optical waveguide in the first region and a second optical waveguide in the second region, —a stack of III-V semiconductor compounds, arranged on a dielectric layer, in the first region, —an intermediate layer, between the optical layer and the support layer, comprising a thermally conductive material forming a single-piece block, arranged in line with the first region and an optical and/or electrical cladding material arranged in line with the second region. A method is employed for manufacturing such a device.

20 Claims, 5 Drawing Sheets

(51) Int. Cl.
*G02B 6/136* (2006.01)
*H01S 5/02* (2006.01)

(52) U.S. Cl.
CPC ............ *H01S 5/021* (2013.01); *H01S 5/0216* (2013.01); *H01S 5/0217* (2013.01); *H01S 5/02492* (2013.01)

(58) Field of Classification Search
CPC .... H01S 5/1032; H01S 5/026; H01S 5/04256; H01S 5/02476; H01S 5/04254; H01S 5/1014; G02B 6/132; G02B 6/136; G02B 6/1228; G02B 6/125; G02B 2006/12061
See application file for complete search history.

(56) References Cited

U.S. PATENT DOCUMENTS

| | | | | |
|---|---|---|---|---|
| 10,256,603 | B2* | 4/2019 | Caër | H01L 23/34 |
| 10,476,231 | B2* | 11/2019 | Menezo | H01S 5/026 |
| 10,488,587 | B2* | 11/2019 | Chantre | H01S 5/026 |
| 2014/0376857 | A1 | 12/2014 | Chantre et al. | |

OTHER PUBLICATIONS

International Written Opinion for International Application No. PCT/FR2021/051494 dated Dec. 22, 2021, 5 pages.

Sysak et al., Hybrid Silicon Laser Technology: A Thermal Perspective, IEEE Journal of Selected Topics in Quantum Electronics, vol. 17, No. 6, (Nov./Dec. 2011), pp. 1490-1498.

Zhang et al., Thermal Management of Hybrid Silicon Ring Lasers for High Temperature Operation, IEEE Journal of Selected Topics in Quantum Electronics vol. 21, No. 6, Nov. 2015, 8 pages.

Durel. J. et al., "Realization of back-side heterogeneous hybrid III-V/Si DBR lasers for silicon photonics," SPIE, vol. 9750, 2016, pp. 97500.

* cited by examiner

PHOTONIC DEVICE WITH IMPROVED HEAT DISSIPATION FOR III-V/SI HETEROGENEOUS LASER AND ASSOCIATED MANUFACTURING METHOD

CROSS-REFERENCE TO RELATED APPLICATIONS

This application is a national phase entry under 35 U.S.C. § 371 of International Patent Application PCT/FR2021/051494, filed Aug. 27, 2021, designating the United States of America and published as International Patent Publication WO 2022/079363 A1 on Apr. 21, 2022, which claims the benefit under Article 8 of the Patent Cooperation Treaty to French Patent Application Serial No. FR2010606, filed Oct. 16, 2020.

TECHNICAL FIELD

The present disclosure relates to the fields of microelectronics, optics, electro-optics and photonics. It relates to, in particular, a photonic device comprising a first optical waveguide and a second waveguide, integrated into an optical layer; the first waveguide is associated with a stack of III-V semiconductors to form a laser source. The photonic device according to the present disclosure comprises a structured intermediate layer, between the optical layer and a support layer, which notably promotes the heat dissipation between the laser source and the support layer.

BACKGROUND

Over the last few years, many solutions and architectures have been developed for the manufacture of heterogeneous (or hybrid) III-V lasers on Si, using the widely available and proven silicon technological platforms of the microelectronics industry.

SOI (silicon-on-insulator) substrates are commonly used for the production of photonic devices. The surface layer made of silicon allows the construction of waveguides and potentially other elements such as optical edge couplers, modulators, detectors, etc. The buried oxide of the SOI substrate acts as cladding, limiting optical losses in the underlying silicon substrate. In order to guarantee good optical cladding quality for all the elements of the photonic device, the buried oxide usually has a thickness of between 1 and 3 microns. A stack of active layers made of III-V materials can then be assembled on the waveguide, with or without an intermediate layer, depending on the approaches. In operation, the III-V stack undergoes heating, which, if it is not controlled by heat dissipation solutions, affects the laser performance. Although the silicon support substrate of an SOI substrate has a very favorable thermal conductivity, the thick layer of buried oxide under the waveguide constitutes a significant barrier to heat dissipation between the III-V stack and the support substrate.

This thermal barrier effect of the buried oxide of a SOI substrate is demonstrated, for example, in the publication by M. N. Sysak et al ("Hybrid silicon laser technology: a thermal perspective," IEEE Journal of selected topics in quantum electronics, VOL. 17, No. 6, pp. 1490-1498 November/December 2011). The solution proposed in this document consists in forming thermal bridges made of poly-silicon segmenting the buried oxide and establishing vertical heat dissipation paths up to the underlying substrate. Of course, these bridges cannot be directly in line with the III-V stack, since the buried oxide is required for the optical cladding: they are offset vertically in line with a peripheral region of the stack.

C. Zhang et al. ("Thermal management of hybrid silicon ring lasers, for high temperature operation," IEEE Journal of selected topics in quantum electronics, VOL. 21, No. 6, November/December 2015) proposes another approach to control the thermal dissipation of a hybrid laser on SOI. It consists in producing a metal bridge between an electrical contact of the III-V stack and the SOI silicon support substrate, on the periphery of the stack. At this location, the surface layer and the buried oxide of the SOI are therefore engraved, giving direct access to the support substrate; here again the thermal bridges are offset in line with a peripheral region of the stack.

Document US2014376857 proposes another integration solution based on interconnected metallization levels formed in an insulating layer, below the waveguide, and acting as heat sinks. Starting from a SOI substrate, a waveguide is formed in the silicon surface layer and the metallization levels are produced above and/or on either side of the waveguide, encapsulated in an insulating layer. The insulating layer is then assembled on a target substrate. The support substrate and thus the buried oxide of the SOI are removed. The stack of active III-V layers is assembled on the rear face of the surface layer, in line with the waveguide. The interconnected metallization levels improve the heat dissipation performance between the waveguide and the target substrate, and more generally between the latter and the stack of active layers of the laser. Here again, the thermal bridges are mainly offset vertically in line with a peripheral region of the stack.

BRIEF SUMMARY

The present disclosure proposes an alternative solution to the solutions of the prior art. It relates to, in particular, a photonic device comprising a first optical waveguide and a second optical waveguide, integrated into an optical layer, the first waveguide being associated with a stack made of III-V semiconductor compounds to form a heterogeneous laser III-V/Si; the photonic device comprises an intermediate layer between the optical layer and a support layer that promotes the heat dissipation between the laser and the support layer. In this alternative, contrary to the solutions of the prior art, the thermal bridges are arranged in line with the laser. The present disclosure also relates to a method for manufacturing the photonic device.

The present disclosure relates to a photonic device comprising:
  a support layer,
  an optical layer extending in a main plane, subdivided into at least a first region and a second region adjacent in the main plane, and comprising a first optical waveguide in the first region and a second optical waveguide in the second region,
  a stack of III-V semiconductor compounds, arranged on a dielectric layer, itself arranged on the first waveguide, in the first region, the stack forming with the first optical waveguide a laser source,
  an intermediate layer, between the optical layer and the support layer, comprising a thermally conductive material forming a single-piece block, arranged in line with the first region and an optical and/or electrical cladding material arranged in line with the second region.

According to advantageous features of the present disclosure, taken alone or in any feasible combination:

the thermally conductive material has a thermal conductivity greater than or equal to 10 W/m/K, 20 W/m/K, 50 W/m/K, or even 100 W/m/K;

the cladding material is chosen from silicon oxide or air, and the thermally conductive material is chosen from silicon, silicon nitride, copper, aluminum nitride, aluminum, alumina;

the first optical waveguide comprises mono-crystalline silicon, amorphous silicon and/or silicon nitride;

the support layer is made of mono-crystalline silicon;

the thermally conductive material and the cladding material have a thickness of between 100 nm and 5 microns, preferably between 300 nm and 3 microns;

the photonic device comprises a bonding interface extending parallel to the main plane, located in the intermediate layer, or between the intermediate layer and the support layer, or between the intermediate layer and the optical layer;

the second waveguide forms part of a passive optical component, such as an edge coupler, or of an active optical component, such as a detector or a modulator;

the optical layer and/or the intermediate layer comprises at least one metal interconnection level to form electrical contacts of an active optical component, and/or to form at least one heat dissipation via between the first waveguide and the thermally conductive material;

the photonic device comprises at least one heat dissipation via between the semiconductor stack and the metal interconnection level;

the—at least one—heat dissipation via comprises a material chosen from tungsten, aluminum or copper.

The present disclosure also relates to a method for manufacturing a photonic device comprising the following steps:

a) providing a silicon-on-insulator substrate comprising a surface layer made of mono-crystalline silicon having a front face and a rear face, a buried dielectric layer arranged against the rear face of the surface layer, and a base substrate;

b) providing a support layer;

c) preparing an optical layer comprising:
  a first optical waveguide in a first region, the waveguide being formed in the surface layer,
  a second optical waveguide, in a second region;

d) forming an intermediate layer arranged on the optical layer or on the support layer or partially on the optical layer and partially on the support layer, the intermediate layer comprising a thermally conductive material forming a single-piece block, and an optical and/or electrical cladding material;

e) assembling the silicon substrate on insulator and the support layer along a bonding interface, the intermediate layer being arranged between the support layer and the optical layer, the thermally conductive material being arranged in line with the first region and the optical and/or electrical cladding material being arranged in line with the second region;

f) removing the base substrate;

g) forming the stack on the dielectric layer, in the first region.

According to advantageous features of the present disclosure, taken alone or in any feasible combination:

the formation of the intermediate layer on the support layer of step d) comprises local etching of the support layer, in an area intended to be assembled facing the second region of the surface layer during step e);

forming the intermediate layer on the support layer of step d) optionally comprises depositing a cladding material in the engraved area of the support layer;

a bonding layer is deposited on the intermediate layer and/or on the optical layer, prior to the assembly step e).

BRIEF DESCRIPTION OF THE DRAWINGS

Other features and advantages of the present disclosure will be clear from the detailed description, made in reference to the appended figures, in which.

The same references in the figures may be used for elements of the same type. The figures are schematic depictions which, for the sake of readability, are not to scale. In particular, the thicknesses of the layers along the z-axis are not to scale relative to the lateral dimensions along the x-axis and the y-axis.

The different possibilities (variants and embodiments shown and/or detailed in the description to follow) must be understood as not being exclusive of each other and may be combined together, even if all combinations are not mentioned in the description.

DETAILED DESCRIPTION

Figure 1A:
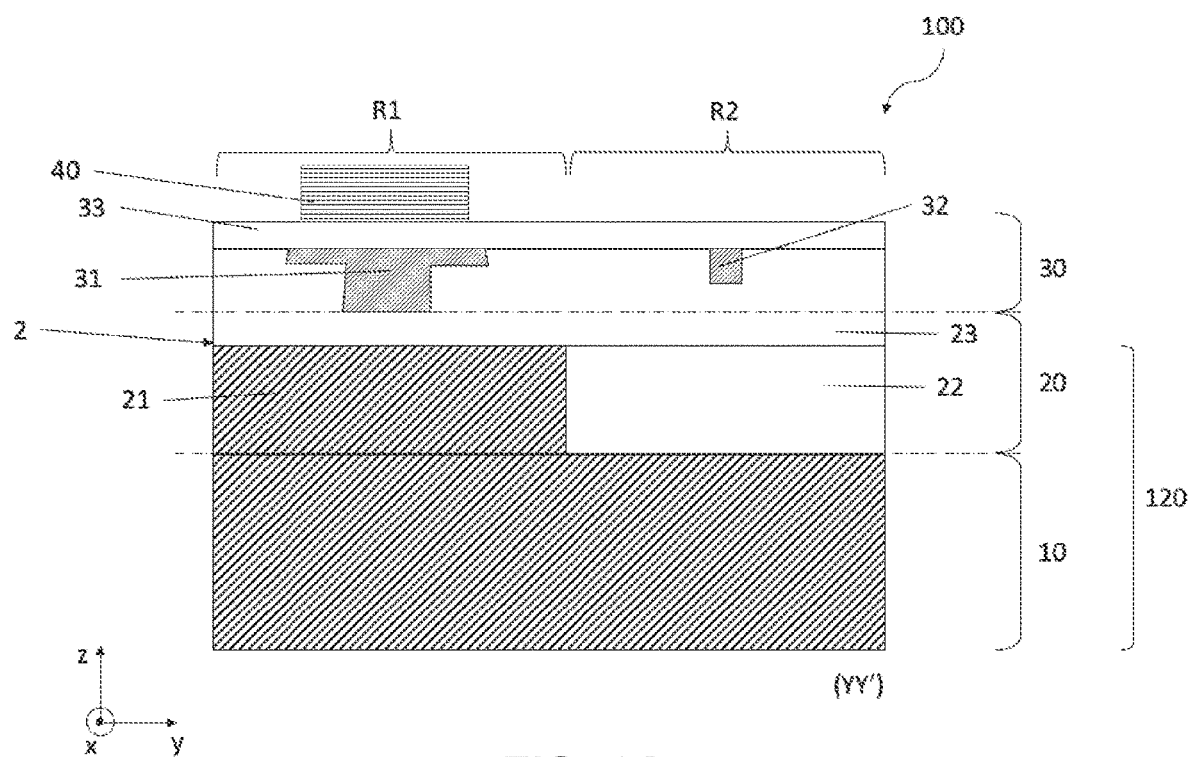
FIGS. 1A and 1B show respectively a sectional view according to (YY') and a plan view of a photonic device according to the present disclosure.

The present disclosure relates to a photonic device 100 comprising an optical layer 30 extending in a main plane (x, y), and subdivided into a plurality of adjacent regions R1, R2 in the main plane, as shown in FIG. 1A. The optical layer 30 comprises at least one first optical waveguide 31 intended to be associated with a stack of semiconductor III-V compounds 40 to form a laser source in a first region R1. In particular, the stack 40 integrates a lower layer having an N-type doping, an active layer and an upper layer having a P-type doping, contact pads (not shown) are respectively connected to the lower layer and to the upper layer. The active layer generates an optical signal when an appropriate potential difference is applied between the contact pads. The stack 40 is optically coupled to the first waveguide 31, in the first region R1. For this, it is arranged above the waveguide 31 and can be separated from it by a dielectric layer 33. The stack 40 and the first waveguide 31 thus form a hybrid III-V/Si waveguide. In a hybrid III-V/Si waveguide, the optical mode is naturally pulled upwards (along the z axis): a smaller thickness of optical cladding material is therefore generally required under the first waveguide 31, in the first region R1.

The first optical waveguide 31 may comprise materials chosen from mono-crystalline silicon, amorphous silicon and/or silicon nitride.

The optical layer 30 also comprises at least one second optical waveguide 32, which is not associated with a laser source. The second waveguide 32 may correspond to, for example, an edge coupler extending the first waveguide 31 or to another waveguide independent of the first (FIG. 1B).

This second waveguide 32 may be made of, for example, silicon or of silicon nitride (SiNx).

Figure 1B:
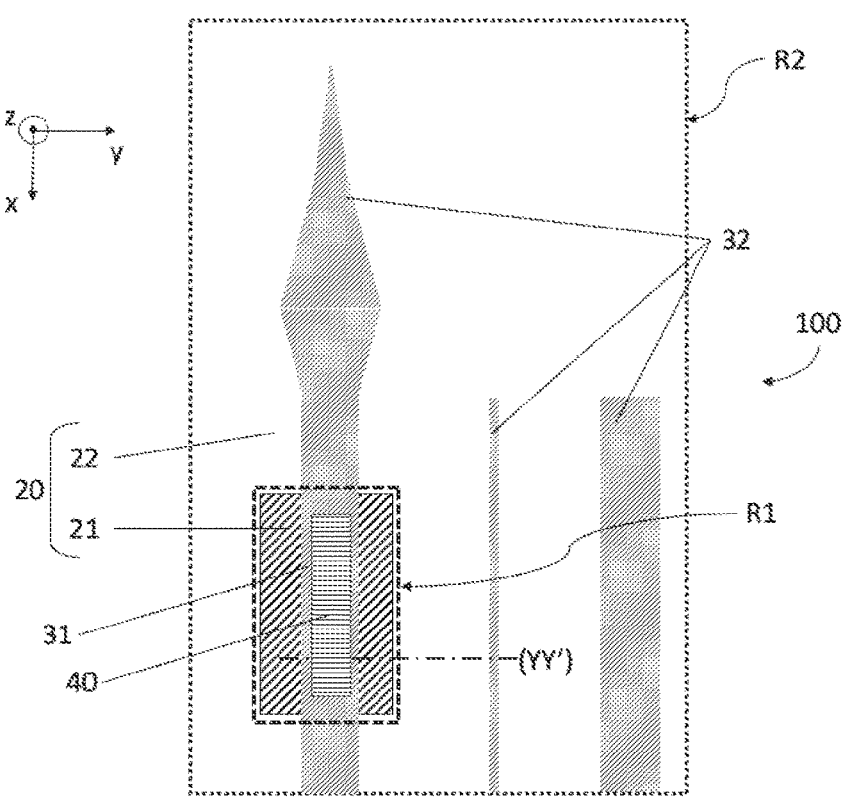

FIG. 1B shows a plan view of at least one part of the photonic device 100: the first region R1, which extends in the main plane (x, y), encompasses the area where the first optical waveguide 31 and the stack 40 are associated. The second region R2 encompasses the other areas of the device 100 in which there are no semiconductor compounds III-V above: in FIG. 1B, this second region R2 corresponds to the internal area at the dotted outline referenced R2, excluding the first region R1.

Hereinafter, a first optical waveguide 31 and a second optical waveguide 32 will be considered, for the sake of simplicity, it being understood that the optical layer 30 of the device 100 can include a plurality thereof.

The photonic device 100 also comprises a support layer 10, preferably made of mono-crystalline silicon. Silicon has the advantage, in addition to its compatibility with the microelectronic manufacturing lines, of having a high heat dissipation coefficient, favorable to the evacuation of the heat generated by the laser source, in particular, by the stack 40.

Between the support layer 10 and the optical layer 30, the photonic device 100 comprises an intermediate layer 20 formed of at least two materials.

The intermediate layer 20 comprises a thermally conductive material 21 forming a single-piece block, arranged in line with the first region R1 and an optical and/or electrical cladding material 22 arranged in line with the second region R2. The thickness of these two materials 21, 22 is adjustable, depending on the type and the features of the photonic device 100. The thermally conductive material 21 and the cladding material 22 typically have a thickness, along the z axis in the figures, of between 100 nm and 5 microns, and preferably between 300 nm and 3 microns.

The thermally conductive material 21 ensures efficient dissipation by its uniform presence below the laser source 40. Advantageously, a material is aimed for that has a thermal conductivity greater than or equal to 10 W/m/K, to 20 W/m/K, to 50 W/m/K, or even to 100 W/m/K. The thermally conductive material 21 may be chosen from, for example, silicon, silicon nitride, aluminum nitride, alumina, copper or aluminum.

The cladding material 22 performs the function of optical cladding under the second waveguide 32, in the second region R2. This material has an optical index less than that of the material forming the second waveguide 32, and, in particular, avoids coupling, with the support layer 10, of the optical signal intended to be propagated in the second waveguide 32. The presence of a large thickness of optical cladding material 22 is particularly favorable in the case of an edge coupler, to move the optical waveguide 32 away from the underlying support layer 10 and prevent optical leaks in the support layer 10. In the case where the second waveguide 32 forms part of an active optical component, such as a detector or a modulator, the thickness of cladding material 22 is also adapted to eliminate or at least to drastically reduce the parasitic capacitances likely to be established between the component and the support layer 10.

The optical and/or electrical cladding material 22 is advantageously silicon oxide; it may also be air. Its thickness of between 100 nm and 5 microns, and preferably between 300 nm and 3 microns, makes it possible to form an effective optical cladding coating for a wide variety of optical waveguides 32 or other optical components, and thus provides great flexibility of architecture of the photonic device 100.

Figure 2A:
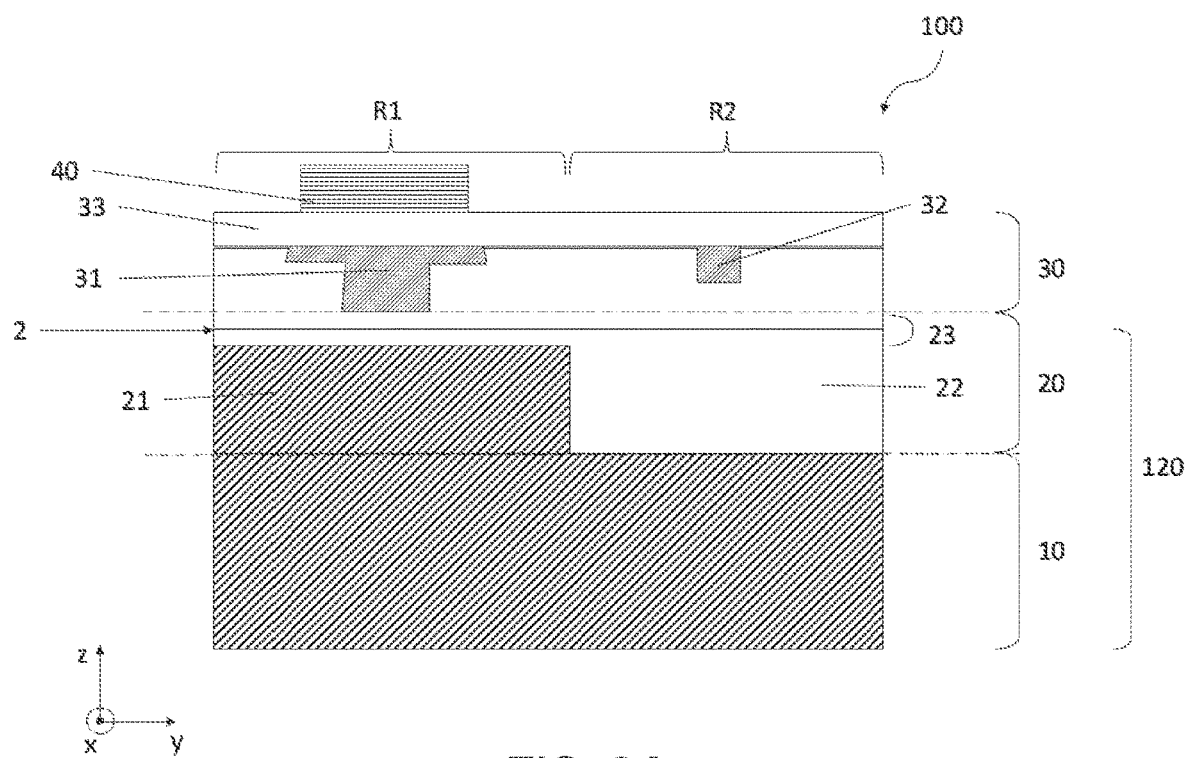
FIGS. 2A and 2B show a first and a second embodiment of a photonic device according to the present disclosure.

As can be seen in FIGS. 1A, 2A. and 2B, the intermediate layer 20 may also comprise a uniform layer 23 directly in contact with the optical layer 30. This layer is called uniform in that it extends into both the first and second regions R1, R2 of the device 100. This uniform layer 23 is advantageously formed of a material having an optical index less than that of the material forming the first 31 and second 32 waveguides, for example, of the same nature as the optical cladding material 22.

Advantageously, the uniform layer 23 has a small thickness, less than 300 nm and typically between 10 nm and 200 nm. Such a thickness greatly limits the thermal insulation effects of the uniform layer 23 in the first region R1, precisely the one in which heating will occur due to the presence of the laser source. A uniform layer 23 that is as thin as possible is advantageous, of course, in line with the first region R1, so as to have the least possible impact on the heat dissipation between the first waveguide 31 and the single-piece block of thermally conductive material 21.

It should be recalled that the optical mode generated by the laser source and guided in the hybrid optical guide, including the first optical waveguide 31, is naturally stretched upwards (toward the stack 40) and therefore does not require a large thickness of optical cladding material to prevent coupling with the materials below.

According to particular embodiments, the optical layer 30 and/or the intermediate layer 20 comprise(s) at least one metal interconnection level to form electrical contacts of an active optical component, and/or to form at least one heat dissipation via 24, 25, 27 between the first waveguide 31 and the thermally conductive material 21 (FIGS. 3A-3D). When there is a metal interconnection level, the uniform layer 23 may be thicker and contain the vias 24, 25, 27 and optionally metal lines 26 connected to the vias. In the optical layer 30, the vias 25 can be in direct contact with the base 31a of the first optical waveguide 31, or in contact by means of a film (not shown), for example, an electrical insulator of small thickness, typically less than 200 nm. In the uniform layer 23, included in the intermediate layer 20, the heat dissipation vias 24, 27 and/or the metal lines 26 may be in direct contact on one side with the central rib 31b of the first waveguide 31 and on the other side with the thermally conductive material 21; alternatively, they may be in contact with these elements by means of a small residual thickness (not shown) of the continuous layer 23, typically less than 200 nm.

Several embodiments and variants of the photonic device 100 will now be described with reference to FIGS. 1A, 2A, 2B, and 3A-3D.

For the different embodiments, the method for manufacturing the photonic device 100 comprises the following steps.

Figure 4:
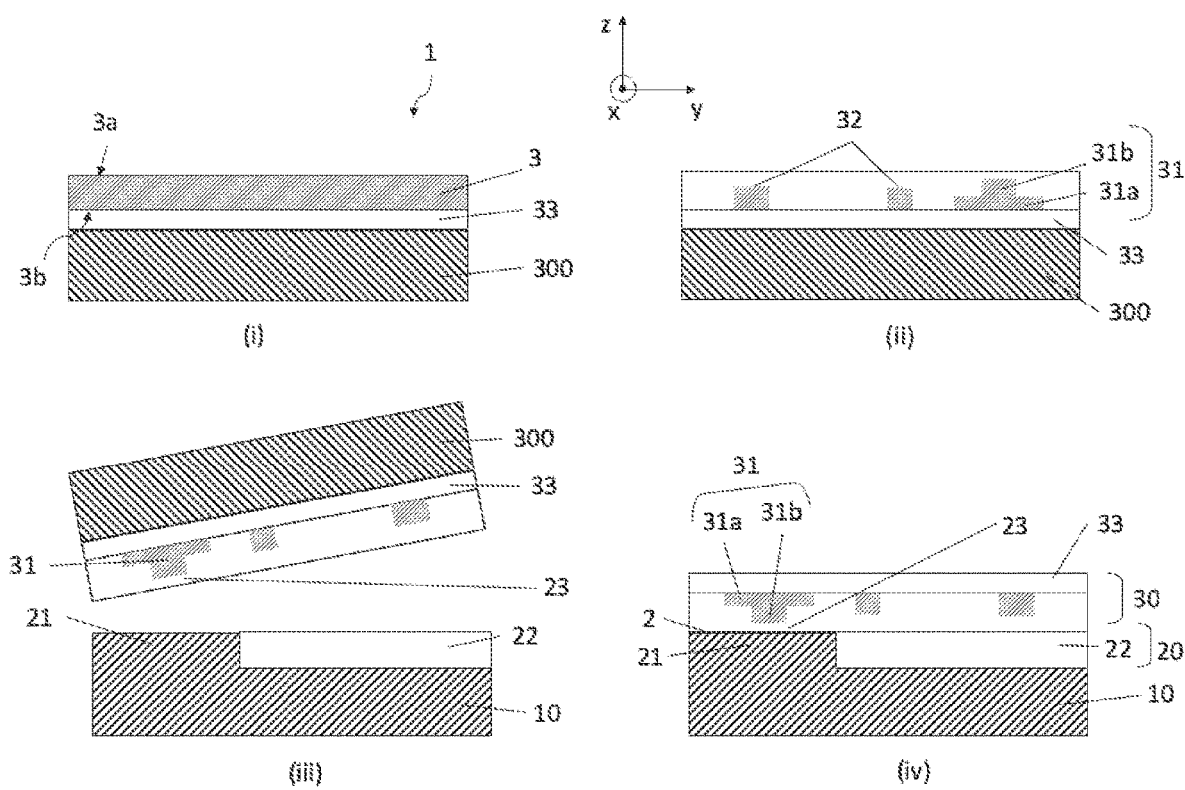
FIG. 4 shows steps of the method for manufacturing a photonic device according to the present disclosure.

A step a) of providing an SOI substrate 1 comprising a surface layer 3 made of mono-crystalline silicon having a front face 3a and a rear face 3b, a buried dielectric layer 33 arranged against the rear face 3b of the surface layer 3, and a base substrate 300 (FIG. 4 (i)). The dielectric layer 33 is generally made of silicon oxide and the base substrate 300 is made of mono-crystalline silicon. The SOI substrate 1 is in the form of a wafer with a thickness of between 300 microns and 1000 microns, and with a diameter of between 150 mm and 450 mm.

The method also comprises a step b) of providing a support layer 10. In general, a mono-crystalline silicon substrate is first formed in the form of a wafer with a thickness of between 300 microns and 1000 microns, and with a diameter of between 150 mm and 450 mm.

The following step c) comprises the production of at least one first optical waveguide 31 in the surface layer 3 of the SOI substrate 1 (FIG. 4 (ii)). The first waveguide 31 will subsequently be associated with a stack of semiconductor III-V compounds 40 to form a laser source, in a first region R1 extending in main plane (x, y).

The first optical waveguide 31 may take different forms. It may form, in particular, a base 31a extending in main plane (x, y), on either side of a central rib 31b, as shown in FIG. 4 (ii).

Other optical waveguides, in particular, at least one second optical waveguide 32, may also be produced in the surface layer 3 made of silicon or close thereto in a second region R2 extending in main plane (x, y).

In general, conventional photolithography, etching and/or deposition processes make it possible to thus structure the surface layer 3 of the SOI substrate 1. The waveguide 31 and other components 32 formed in the surface layer 3 or in a layer, for example, made of silicon nitride, adjacent or above (not shown), are then encapsulated in an encapsulation layer, usually made of silicon oxide. This encapsulation layer may have a thickness identical to the thickness of the waveguide 31 and be flush with the same surface level as the waveguide 31. It may optionally completely cover the first waveguide 31 and the second waveguide 32, as shown in FIG. 4 (ii). The portion of the encapsulation layer above the first waveguide 31 is included in the uniform layer 23 mentioned in a previous passage relative to the photonic device 100.

As will be described with reference to the particular embodiments shown in FIGS. 3A-3D, at least one metal interconnection level may also be produced through and/or in the encapsulation layer. The role of the interconnection level is to form electrical contacts for one (or more) active optical component(s), and/or to form at least one heat dissipation via 24, 25, 27 between the first waveguide 31 and the thermally conductive material 21.

The manufacturing method also comprises a step d) of forming an intermediate layer 20, arranged on the optical layer 30 or on the support layer 10 or partially on the optical layer 30 and partially on the support layer 10. It is essentially this step d) that distinguishes the different embodiments of the present disclosure, which will be described below.

Then, a step e) of assembling the SOI substrate 1 and the support layer 10, along a bonding interface 2, is carried out (FIG. 4 (iii)), to form a bonded assembly. The intermediate layer 20 of the photonic device 100, including the uniform layer 23, is thus buried between the optical layer 30 and the support layer 10. The assembly is preferably based on direct bonding, by molecular adhesion, that is to say not requiring the addition of any adhesive material, but could alternatively implement adhesive bonding.

As is well known, care will be taken to prepare the surfaces to be assembled so that they exhibit a very low roughness (typically less than 0.5 nm RMS) and a very low level of particulate, organic and/or metallic contamination. Known techniques for chemical mechanical polishing, chemical cleaning, activation by plasma may be implemented, in particular, for the preparation of the surfaces to be assembled.

It should be noted that, in the particular case where the cladding material 22 is air, the bonding is carried out with cavities in line with the second region R2.

Finally, the manufacturing method comprises a step f) of removing the base substrate 300 from the SOI substrate 1 in order to leave only the dielectric layer 33 on the front face side of the bonded structure, the support layer 10 corresponding to its rear face (FIG. 4 (iv)).

The subsequent step g) of forming the stack 40 on the dielectric layer 33 may be carried out, for example, by assembling between a face of the stack 40 and the dielectric layer 33, for example, by direct or adhesive bonding.

The subsequent steps of forming other components and electrical connection of the laser source are not described in detail here. It should be noted that the other components may be of optical or electro-optical nature.

The singularization steps in the form of a chip of the photonic device 100 by cutting the final structure, and the mounting steps ("packaging") are not detailed since they are in accordance with the techniques known in the prior art.

First Embodiment

Returning to the description of the particular embodiments, the figure shows a photonic device 100 according to a first embodiment of the present disclosure.

The intermediate layer 20 comprises:
a uniform layer 23 between the first waveguide 31 and the thermally conductive material 21,
a bonding interface 2,
and a structured layer (produced on the support layer 10) made of the thermally conductive material 21 and the optical cladding material 22.

The uniform layer 23, deposited on the first waveguide 31 during step d) of the manufacturing method, is formed of a material making it possible to produce an optical cladding, that is to say having an optical index less than that of the material forming the first waveguide 31. Advantageously, this material is the same as the optical cladding material 22. Preferably, the uniform layer 23 is part of the encapsulation layer that encompasses the waveguide 31 and other elements 32 that have been formed in the surface layer 3. Like the encapsulation layer, the uniform layer 23 can therefore be deposited on the first waveguide 31 of the SOI structure by a known deposition technique, for example, by chemical vapor deposition, in step d), prior to the assembly step e). Mechanical-chemical polishing and cleaning steps are also carried out in order to ensure the flatness of the uniform layer 23.

The structured layer is prepared starting from a solid silicon support substrate 120, on the front face of which areas are engraved, then filled with the optical cladding material 22 (or left empty, in the case where the optical cladding material 22 is air). Here again, known techniques of lithography, dry or wet etching, deposition and potentially polishing are implemented for the formation of the structured layer. The non-engraved areas form the single-piece blocks of thermally conductive material 21, made of silicon, which here form an integral part of the support substrate 120.

The location of the engraved areas and of the non-engraved areas is defined so that, after the assembly step e), the engraved areas are facing the second region R2 of the optical layer 30, and the non-engraved areas are facing the first region R1. In this first embodiment, step e) therefore comprises a sequence of aligning the substrates to be assembled, prior to their contact for bonding, so as to position the aforementioned areas of the support substrate 120 facing the associated regions of the optical layer 30.

FIG. 1A shows the photonic device 100 obtained by the manufacturing method according to the present disclosure. The intermediate layer 20, between the optical layer 30 and the support layer 10, comprises a uniform layer 23, an optical cladding material 22 and a thermally conductive material 21 forming a single-piece block in line with the first region R1. The presence of this block and the small thickness of the uniform layer 23 promote the heat dissipation of the heat that will be generated, at the first region R1, by the laser source. The high cladding thickness, facing the second region R2, makes it possible to accommodate a wide variety of other optical components (waveguide, light coupler, detector, modulator . . . ) by limiting the parasitic optical or capacitive couplings with the support layer 10.

According to a variant of the first embodiment shown in FIG. 2A, the uniform layer 23 can be formed, in step d) of the method, partially on the side of the optical layer 30, on the SOI substrate 1 and partially of the support substrate 120, on the thermally conductive material 21 and on the cladding material 22; the bonding interface 2 is then found in the uniform layer 23.

According to another variant of the first embodiment, the thermally conductive material 21 is not an integral part of the support substrate 120 but is made of a material deposited on the support layer 10. The material is in this case chosen from materials having good thermal conductivity.

Second Embodiment

Figure 2B:
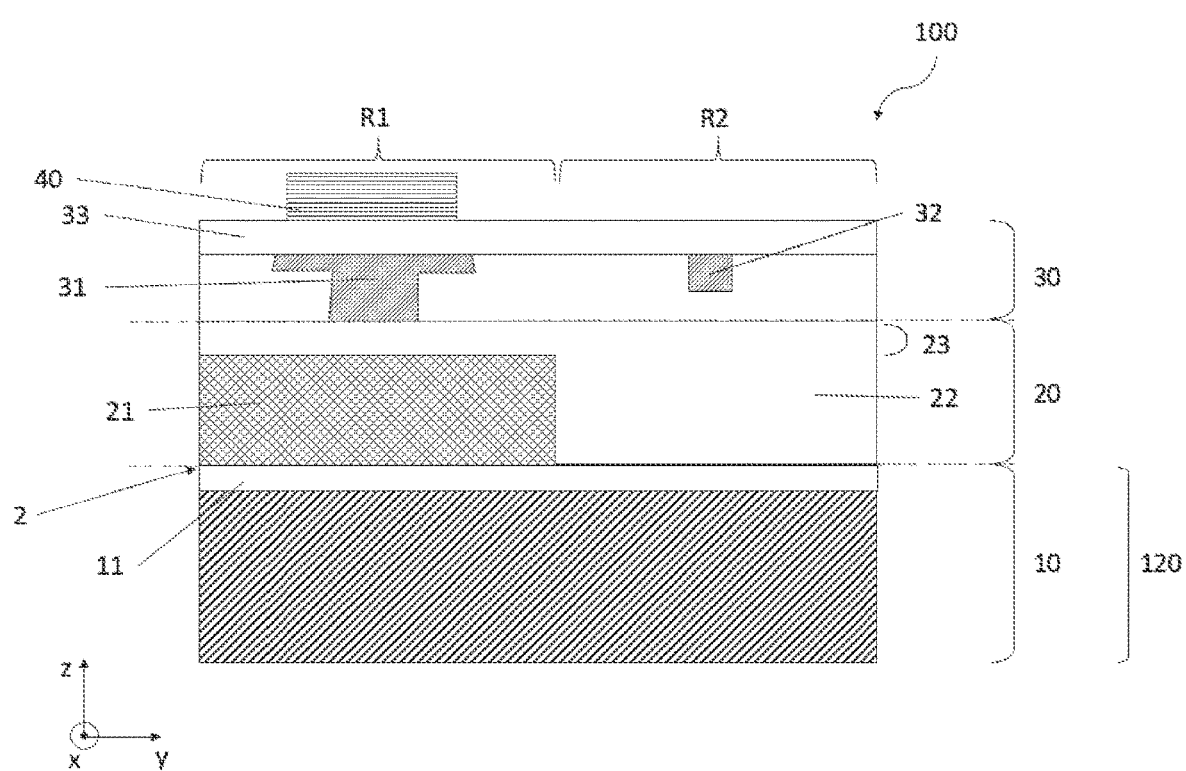

FIG. 2B presents a photonic device 100 according to the second embodiment of the present disclosure.

In step d) of the method, the intermediate layer 20 is entirely made on the side of the optical layer 30, namely on the optical waveguides 31, 32 of the SOI substrate 1.

The intermediate layer 20 is composed of the uniform layer 23, the thermally conductive material 21 and the optical cladding material 22.

It can be prepared, for example, by depositing a homogeneous layer of cladding material 22 on the optical waveguides 31, 32 of the SOI substrate 1, then by etching this cladding material 22 and local deposition of a thermally conductive material 21 to form a single-piece block directly in line with the first region R1. The uniform layer 23 is then of the same nature as the cladding material 22.

Alternatively, after deposition of the uniform layer 23 on the optical waveguides 31, 32 of the SOI substrate 1, the thermally conductive material 21 is formed only in line with the first region R1. The cladding material 22 may, for its part, be formed of air; the subsequent assembly step e) therefore takes place with cavities in the second region R2.

Known techniques of lithography, dry or wet etching, deposition and polishing may be implemented for the formation of such an intermediate layer 20.

According to this second embodiment, the support layer 10 can be assembled directly (in step e)) on the intermediate layer 20 formed, without requiring an alignment sequence since the support layer 10 is devoid of patterns.

The support layer 10 may optionally comprise a bonding layer 11, to facilitate the assembly.

According to a variant, a bonding layer may also be deposited on the intermediate layer 20 before its assembly on the support layer 10.

These bonding layers 11 may be formed of a thermally conductive material (for example, of the same nature as the thermally conductive material 21) or insulating material (for example, of the same nature as the cladding material 22). In the latter case, care will be taken to limit the thickness (typically less than 200 nm) of the bonding layers 11, so as not to negatively affect the heat dissipation between the one-piece of thermally conductive material 21 and the support layer 10.

Third Embodiment

FIGS. 3A-3D show variants of a third embodiment of the present disclosure, combined with the other embodiments and variants, which is characterized by the presence of at least one heat dissipation via 24, 25, 27 arranged between the first optical waveguide 31 and the single-piece block made of a thermally conductive material 21.

Figure 3A:
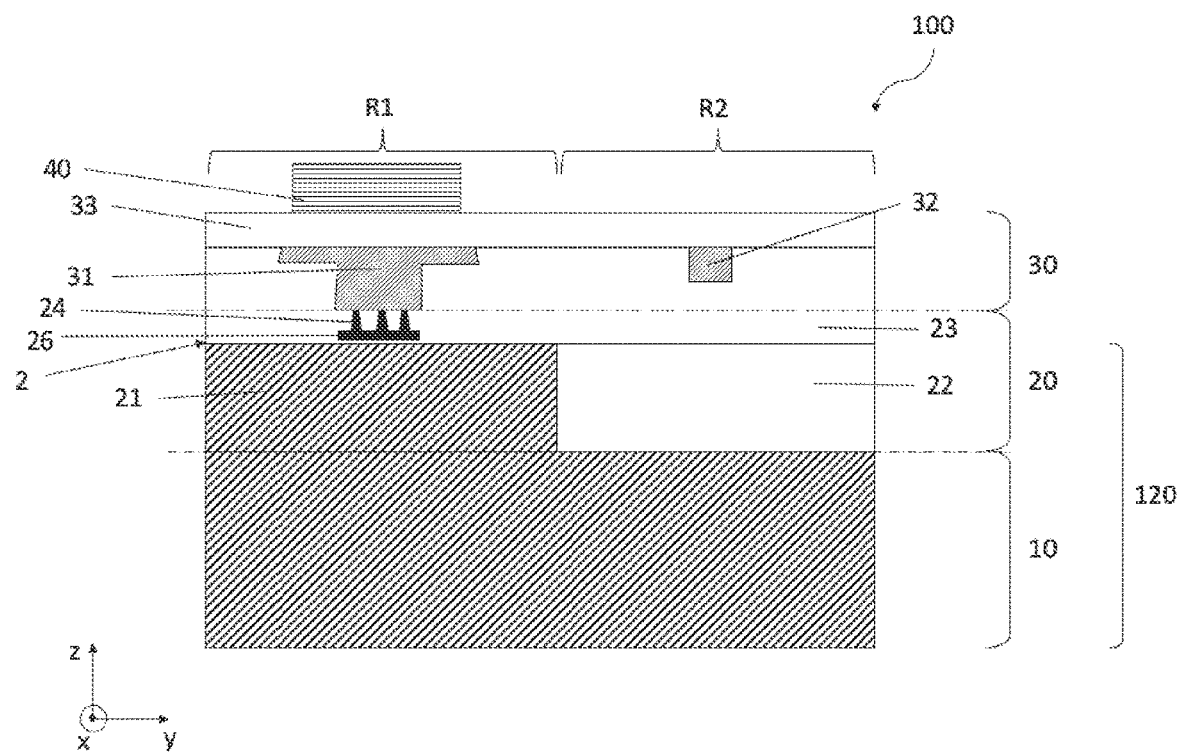
FIGS. 3A-3D show several variants of a third embodiment of a photonic device according to the present disclosure.
Figure 3B:
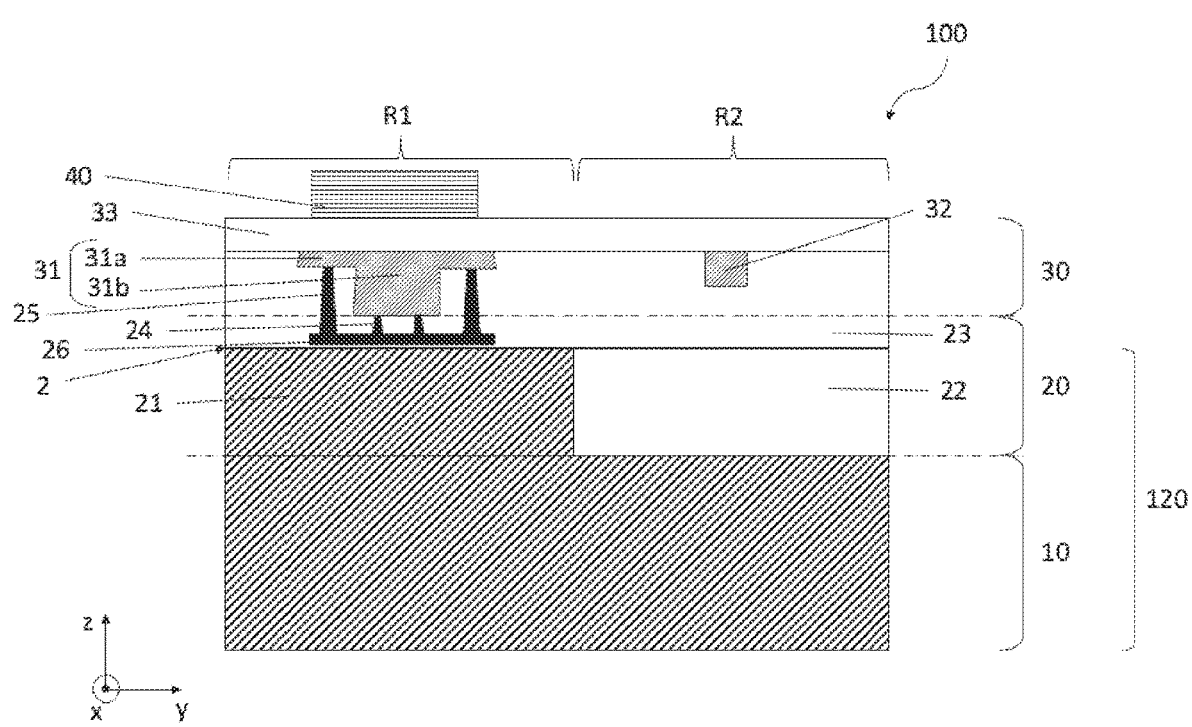

In the example shown in FIG. 3A, several vias 24 extend between the central rib 31b of the first waveguide 31 and the block 21. In FIG. 3B, other vias 25 extend from the base 31a of the first waveguide 31 to the single-piece block made of thermally conductive material 21. It is also possible to imagine that vias 25 extend only between the base 31a and the block 21. Metal lines 26 may also be present, connecting together several or all the vias 24, 25, in order to increase their thermal conductivity capacity.

Figure 3C:
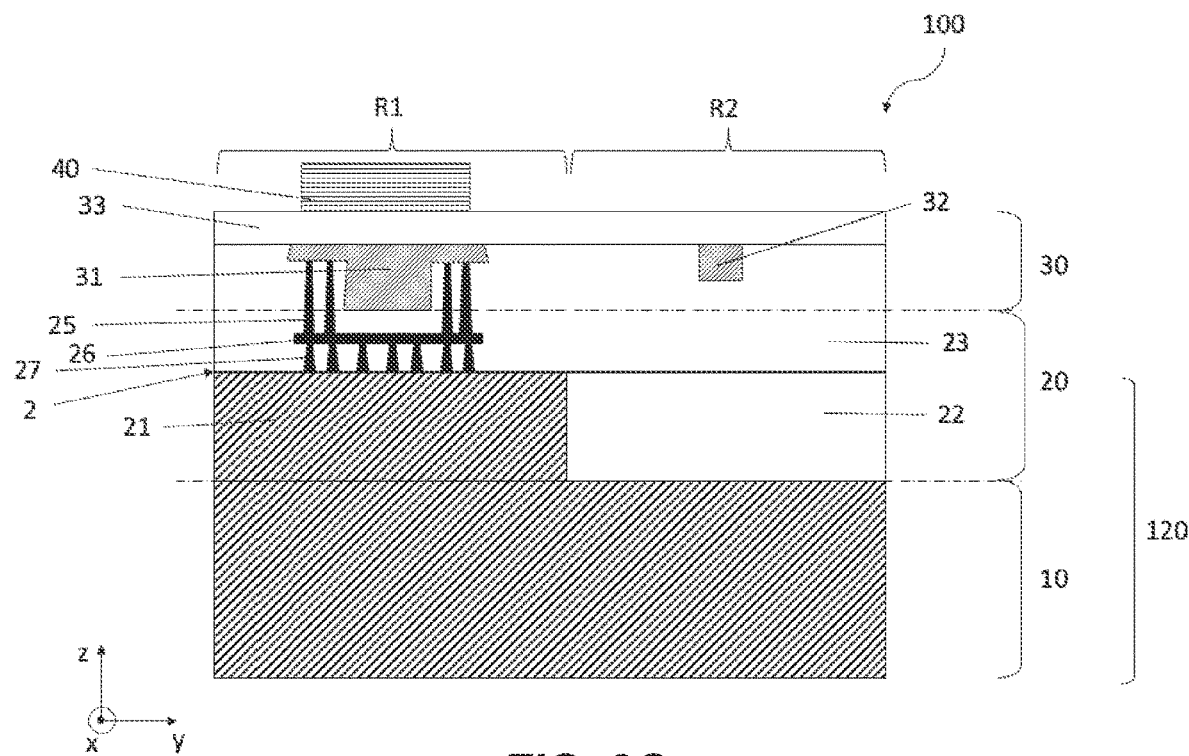

According to another variant shown in FIG. 3C, heat dissipation vias 25 extend from the base 31a of the first waveguide 31 to a metal line 26, and other dissipation vias 27 then extend toward the single-piece block made of thermally conductive material 21.

The vias 24, 25, 27 may be directly in contact with the waveguide 31 and/or with the thermally conductive material 21; alternatively, an electrically insulating film (not shown) may exist between the vias 24, 25, 27 and the waveguide 31, as well as between the vias 24, 25, 27 and the thermally conductive material 21. The insulating film has a very small thickness (typically less than 200 nm) in order to have only a negligible impact on the thermal path.

The heat dissipation via(s) 24, 25, 27 is (are) made of a material having high thermal conductivity. By way of example, mention may be made of tungsten, aluminum or copper. By way of example, a via may have a section in the main plane (x, y) of the order of 0.4×0.4 square micron.

The heat dissipation vias 24, 25, 27 are produced, during step d) of the manufacturing method according to the present disclosure, from conventional techniques for etching and filling trenches. Note that the aforementioned vias 24, 25, 27 may form part of a metal interconnection level intended to form electrical contacts of an active optical component of the photonic device 100.

The third embodiment shown in FIGS. 3A-3D provides a composition of the intermediate layer 20 similar to that of the first embodiment, with in addition, the presence of heat dissipation vias 24, 25, 27 and potentially metal lines 26.

The intermediate layer 20, between the optical layer 30 and the support layer 10, comprises an optical cladding material 22 and a thermally conductive material 21 forming a single-piece block in line with the first region R1. The—at least one—heat dissipation via 24, 25, 27 arranged, in the first region R1, between the first waveguide 31 and the single-piece block 21 further improves the heat dissipation properties.

Figure 3D:
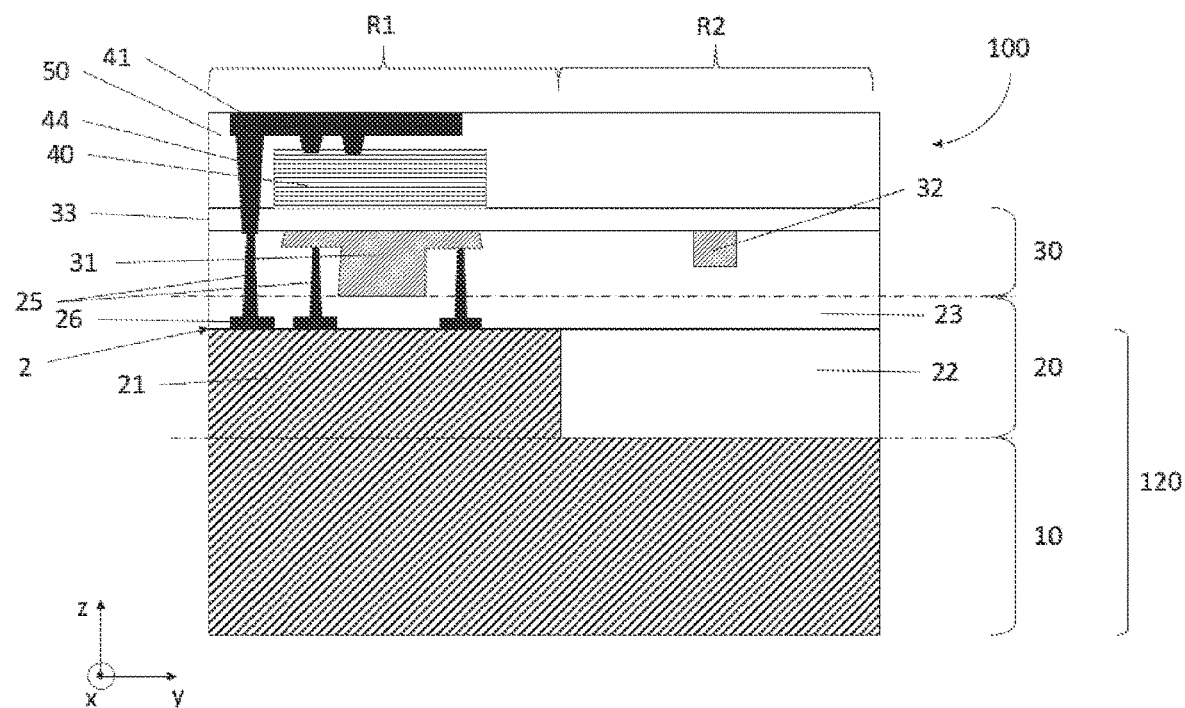

FIG. 3D proposes another variant of the third embodiment that integrates at least one other heat dissipation via 44 (called second via 44) between the stack of III-V semiconductor compounds 40 and an underlying heat dissipation via 25 (called first via 25), extending in the optical layer 30. After assembly of the stack 40 on the dielectric layer 33, in line with the first optical waveguide 31 and in the first region RI, a coating layer 50 is formed on and potentially around the stack 40. At least one metal contact 41 is made on the upper layer of the stack 40, which is connected by the second via 44 to a first via 25. The presence of this second via 44 also improves heat dissipation toward the single-piece block 21.

It should also be noted that the first optical waveguide 31 has been shown in a particular shape with a base 31a and a central rib 31b, but that it could take any known form or configuration for the optical waveguides.

Of course, the present disclosure is not limited to the described embodiments and variant embodiments can be provided thereto without departing from the scope of the invention as defined by the claims.

The invention claimed is:

1. A photonic device comprising:
   a support layer;
   an optical layer extending in a main plane (x, y), subdivided at least into a first region and a second region adjacent in the main plane (x, y), the optical layer comprising a first optical waveguide in the first region and a second optical waveguide in the second region;
   a stack of III-V semiconductor compounds, arranged on a dielectric layer, itself arranged on the first waveguide, in the first region, the stack forming with the first optical waveguide a laser source;
   an intermediate layer, between the optical layer and the support layer, comprising a thermally conductive material forming a single-piece block, arranged in line with the first region and an optical and/or electrical cladding material arranged in line with the second region; and
   wherein the optical layer and/or the intermediate layer comprises at least one metal interconnection level to form electrical contacts of an active optical component, and/or to form at least one heat dissipation via between the first waveguide and the thermally conductive material.

2. The photonic device of claim 1, wherein the thermally conductive material-(21) has a thermal conductivity greater than or equal to 10 W/m/K.

3. The photonic device of claim 2, wherein the thermally conductive material has a thermal conductivity greater than or equal to 20 W/m/K.

4. The photonic device of claim 3, wherein the thermally conductive material has a thermal conductivity greater than or equal to 50 W/m/K.

5. The photonic device of claim 4, wherein the thermally conductive material has a thermal conductivity greater than or equal to 100 W/m/K.

6. The photonic device of claim 1, wherein the cladding material comprises silicon oxide or air, and the thermally conductive material comprises silicon, silicon nitride, copper, aluminum nitride, aluminum, or alumina.

7. The photonic device of claim 1, wherein the first optical waveguide comprises mono-crystalline silicon, amorphous silicon and/or silicon nitride.

8. The photonic device of claim 1, wherein the support layer is mono-crystalline silicon.

9. The photonic device of claim 1, wherein the thermally conductive material and the cladding material have a thickness of between 100 nm and 5 microns, preferentially between 300 nm and 3 microns.

10. The photonic device of claim 9, wherein the thermally conductive material and the cladding material have a thickness of between 300 nm and 3 microns.

11. The photonic device of claim 1, further comprising a bonding interface extending parallel to the main plane (x, y), the bonding interface located in the intermediate layer, or between the intermediate layer and the support layer, or between the intermediate layer and the optical layer.

12. The photonic device of claim 1, wherein the second waveguide forms part of a passive optical component or an active optical component.

13. The photonic device of claim 12, wherein the second waveguide forms part of an edge coupler.

14. The photonic device of claim 12, wherein the second waveguide forms part of a detector or a modulator.

15. The photonic device of claim 1, further comprising at least one heat dissipation via between the semiconductor stack and the metal interconnection level.

16. The photonic device of claim 1, wherein the at least one heat dissipation via comprises a material chosen from tungsten, aluminum or copper.

17. A method for manufacturing a photonic device, comprising:
   a) providing a silicon-on-insulator substrate comprising a mono-crystalline silicon surface layer having a front face and a rear face, a buried dielectric layer disposed adjacent the rear face of the surface layer, and a base substrate;
   b) providing a support layer;
   c) providing an optical layer comprising:
      a first optical waveguide in a first region, the waveguide being formed in the surface layer, and
      a second optical waveguide, in a second region;
   d) forming an intermediate layer disposed on the optical layer or on the support layer or partially on the optical layer and partially on the support layer, the intermediate layer comprising a thermally conductive material forming a single-piece block, and an optical and/or electrical cladding material;
   e) assembling the silicon-on-insulator substrate and the support layer along a bonding interface, the intermediate layer being disposed between the support layer and the optical layer, the thermally conductive material being arranged in line with the first region and the optical and/or electrical cladding material being arranged in line with the second region;
   f) removing the base substrate; and
   g) forming a stack of III-V semiconductor compounds on the dielectric layer, in the first region.

18. The method of claim 17, wherein the forming of the intermediate layer on the support layer comprises:
   local etching of the support layer, in an area intended to be assembled facing the second region of the surface layer during the assembling of the silicon-on-insulator substrate and the support layer.

19. The method of claim 18, further comprising depositing a bonding layer on the intermediate layer and/or on the optical layer, prior to the assembling of the silicon-on-insulator substrate and the support layer.

20. The method of claim 18, further comprising depositing a cladding material in the engraved area.

* * * * *